United States Patent [19]

Cushman

[11] 3,713,575

[45] Jan. 30, 1973

[54] BONDING APPARATUS HAVING MEANS FOR CONTINUOUS MONITORING OF THE BOND

[75] Inventor: Robert Holbrook Cushman, Huntingdon Valley, Pa.

[73] Assignee: Western Electric Company, Incorporated, New York, N.Y.

[22] Filed: June 29, 1971

[21] Appl. No.: 157,959

[52] U.S. Cl. ........................228/6, 29/407, 29/471.1, 29/628, 219/78, 228/49

[51] Int. Cl. ................................................B23k 1/00

[58] Field of Search ......228/3, 4, 5, 6, 44, 49; 29/49, 29/626, 628, 592, 470.1, 471.1, 407; 219/78, 85

[56] References Cited

UNITED STATES PATENTS

| | | | |
|---|---|---|---|
| 3,656,232 | 4/1972 | Hinchey | 29/407 |
| 3,617,682 | 11/1971 | Hall | 228/4 |
| 3,559,279 | 2/1971 | Miklaszewski | 29/493 |
| 3,458,102 | 7/1969 | Zanger et al. | 228/3 |
| 3,452,917 | 7/1969 | Schneider | 228/49 |
| 3,290,479 | 12/1966 | Avedissian | 219/85 |
| 3,048,690 | 8/1962 | Byrnes, Jr. et al. | 219/85 |

*Primary Examiner*—J. Spencer Overholser
*Assistant Examiner*—Robert J. Craig
*Attorney*—R. J. Guenther et al.

[57] ABSTRACT

Bonding apparatus is disclosed in which a housing and ram are combined with a transparent pressure plate, a transparent device carrier and an optical arrangement for continuously monitoring the parts during the bonding operation.

8 Claims, 4 Drawing Figures

INVENTOR
R. H. CUSHMAN
BY [signature]

ATTORNEY

BONDING APPARATUS HAVING MEANS FOR CONTINUOUS MONITORING OF THE BOND

BACKGROUND OF THE INVENTION

1. Field of the Invention

This invention relates to bonding apparatus and pertains to the kind in which all of the leads on a miniature circuit device are simultaneously bonded to all of the lands on a circuit device support.

2. Description of the Prior Art

Sub-miniature circuit devices are too small to connect directly to large electrical apparatus or circuits and so an interface device is required. Typically, the interface device may be a circuit device support such as a lead frame and the interface is formed by bonding leads on the circuit device to corresponding lands on the circuit device support. Because of the leads on the sub-miniature circuit device are so tiny, however, maintaining alignment between the leads and lands is an extremely difficult and delicate maneuver. In fact, it is so difficult that a thoroughly acceptable solution is yet to be found.

One of the most persistent problems in the aligning process is the difficulty of monitoring the overlapping leads and lands during the bonding phase. Heretofore, the bond was made blind. That is, while the leads and lands were visible during initial alignment, they ceased to be visible during the bonding step; i.e., they became obscured as the bonding ram moved into position. As a consequence, any shift in alignment which might occur between the leads and lands during bonding would go undetected and would often produce a worthless union.

It is an object of this invention, therefore, to achieve continuous monitoring of the alignment between leads and lands during the entire bonding phase.

Still another object of this invention is to reduce the number of defects which occur during the bonding of sub-miniature circuits to circuit device supporting structures.

It is another object of this invention to simplify the process of joining sub-miniature circuit devices to circuit device supporting structures.

SUMMARY OF THE INVENTION

The foregoing objects are achieved in a preferred embodiment of this invention wherein a housing and a ram are combined with a pressure plate and a device carrier. More specifically, the housing locates lands on the front surface of a circuit device support in register with leads on a circuit device; the ram simultaneously applies heat and pressure to the circuit device support; and the pressure plate and device carrier cooperate to align and support the circuit device, resist pressure exerted by the ram and permit continuous optical monitoring of the leads and lands during the bonding process.

According to one feature of this invention, bonds are improved by applying heat and pressure to the back surface of the circuit device support.

According to another feature of this invention, continuous monitoring during the bonding phase is achieved by fabricating the pressure plate and device carrier from transparent materials, applying heat and pressure to the back surface of the circuit device support, positioning the leads and lands above the transparent pressure plate and device carrier and observing the leads and lands through the plate and carrier during the period in which heat and pressure is applied.

According to another feature of this invention, bonds are improved by including a raised portion on each lead of a circuit device.

According to another feature of this invention, bonds are improved by fabricating the leads in the circuit device from an electrically conducting material such as copper and fabricating the raised portion thereon from a noble metal such as gold.

DETAILED DESCRIPTION

Figure 1:
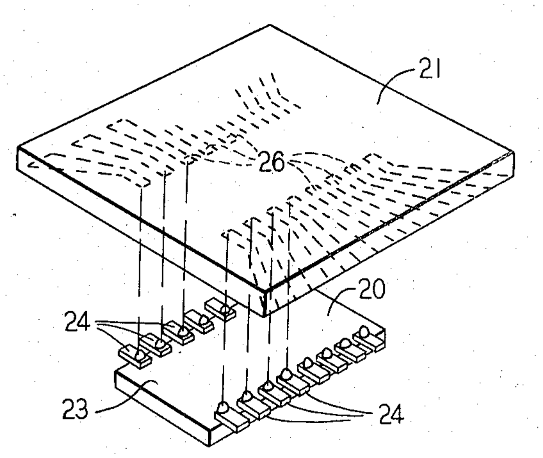
FIG. 1 is a view taken in perspective of a typical circuit device and a typical circuit device support which are to be bonded in accordance with this invention.
Figure 2:
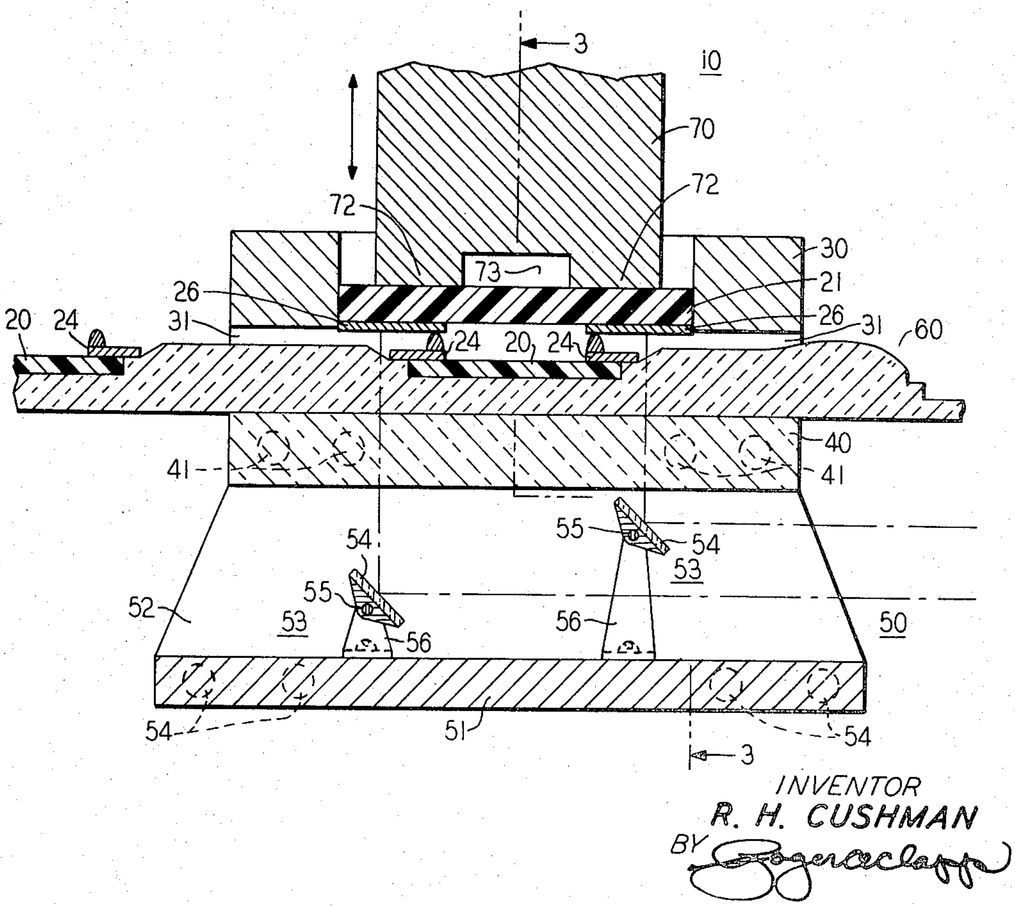
FIG. 2 is a side elevation view taken in section of a bonding machine in accordance with this invention.

Referring to FIG. 2, bonding apparatus 10 is disclosed which is adapted to join sub-miniature circuit devices to appropriate circuit device supports in single unitary assemblies. It comprises a housing 30, a pressure plate 40, a base assembly 50, a carrier 60 and a ram 70. The embodiment illustrated is particularly useful for joining such items as the circuit device, or chip, 20 and the lead frame 21 shown in FIG. 1.

As illustrated in FIG. 1, a typical chip 20 comprises a substrate 23 which supports integrated circuitry terminated on a plurality of leads 24. Similarly, a typical lead frame 22 comprises a substrate 25 having on its front surface a plurality of deposited or printed circuits terminating on lands 26. When fused in a rigid unitary structure, the leads 24 on the circuit chip 20 will be bonded to the lands 26 on the lead frame 22.

Figure 3:
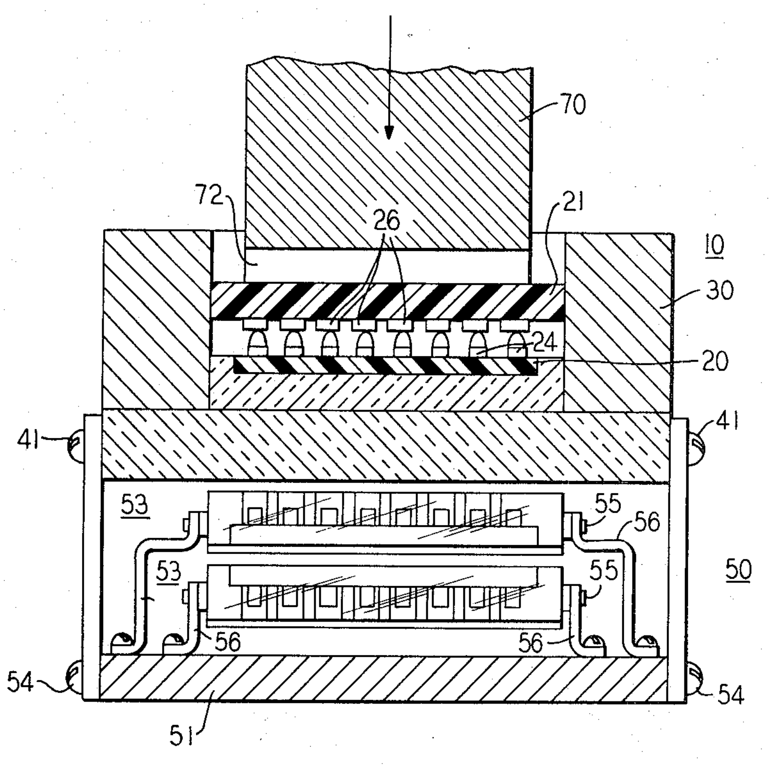
FIG. 3 is an end elevation view taken in section of the bonding machine shown in FIG. 2.

To achieve the bond, the chip 20 and the lead frame 21 are inserted in the housing 30. As best seen in FIGS. 2 and 3, the housing 30 is hollow to accommodate the ram 70 as well as the chip 20 and lead frame 21. Except for slots 31 to permit the carrier 60 ingress and egress, the exterior shape is of no particular consequence and may conveniently be rectangular, as shown in the illustrated embodiment. It must be strong enough, however, to resist high internal heat and pressure and is, therefore, advantageously fabricated from a strong material such as stainless steel.

As illustrated in FIG. 2, the ram 70 enters one end of the hollow interior of the housing 30, the pressure plate 40 closes off the other end and the space between the two accommodates the lead frame 21, chip 20 and carrier 60. The pressure plate 40 is transparent and must be strong enough to withstand the forces exerted by the ram 70 during bonding. Advantageously, therefore, it is made of a strong transparent material such as quartz. Moreover, it is rigidly attached to the housing 30, as by gluing or welding, and includes provision for accommodating four sets of mounting screws 41, by which it is rigidly joined to the base assembly 50.

The base assembly 50 comprises a base plate 51, two supporting brackets 52 and two mirror units 53. The base plate 51 is made of a rigid material such as stainless steel. Like the pressure plate 40, it is drilled to accommodate mounting screws 54. The support brackets 52 are also made of sturdy material such as stainless steel. As shown in FIG. 3, they are interposed between the pressure plate 40 and the base plate 51 and are rigidly joined thereto by the screws 54.

The mirror units 53 each comprise a mirror 54, a mounting or pivot bar 55 and two mounting struts 56. As best seen from FIGS. 1 and 2, the pivot bar 55 is disposed between the mounting struts 56 so that the mirror 54 can be rotatably adjusted to a predetermined position beneath the pressure plate 40. With the mirrors properly adjusted, the image seen by a viewer, as shown in FIG. 3, are the portions of the pressure plate 40 and the carrier 60 which are adjacent to the overlapping portions of the leads 24 and the lands 26.

The carrier 60 is transparent and transports the chips 20. It may advantageously be made of a rigid material such as quartz or a relatively soft material such as Teflon. As best seen in FIG. 2, it is indented so that it can accept a plurality of chips 20 and carry them serially into position beneath the ram 70.

The ram 70 is designed to transmit heat and pressure sufficient to form a bond between overlapping portions of the leads 24 and the lands 26. Except for the portion 71, which engages the lead frame 20 as shown in FIGS. 2 and 3, it is a cylindrical rod driven by a conventional press (not shown) and heated by a conventional heating device such as a heating coil (not shown). The portion 71, however, is exceedingly simple in design, i.e., it comprises two shoulders 72 which are separated by a slot 73. It has been discovered that in order to obtain a suitable bond, it is only necessary that the shoulders 72 be located generally over the overlapping portions of the leads 24 and lands 26 when heat and pressure are applied to the back surface of the lead frame 21.

In operation, the carrier 60 is inserted into the housing 30 through a slot 31 and adjusted until a chip 20 is suitably positioned as determined from the images reflected in the mirrors 54. Next, the lead frame 21 is inserted into the housing 30 with its front surface nearest to the chip 20 and positioned so as to be located beneath the ram 70. Thereafter, final adjustments are made to the carrier 60 until proper alignment is achieved between the leads 24 and the lands 26 as determined by observation in the mirrors 54. Once the proper alignment is obtained, the ram 70 is then brought into position against the back surface of the lead frame 21 and heat and pressure are applied thereto. As heat and pressure are applied, the operator monitors the condition of the forming bond through the transparent pressure plate 40, the carrier 60 and the mirrors 54. If any misalignment occurs, the ram 70 can be withdrawn and corrections made. If none occur, however, heat and pressure continue to be applied until the required bond is formed.

It will be understood that the carrier 60 can take alternative forms. It can, for example, be either liquid, semi-liquid or an integral part of the pressure plate 40; i.e., an indentation. If it is semi-liquid, the material in the immediate bond area will become quasi-molten during the bond while the surrounding material, because of its lower temperature, will not. The surrounding material, therefore, will effectively contain or entrap the semi-molten material. Thus, as the temperature in the bond area changes from approximately room temperature up to the bonding temperature, the ductility of the carrier material changes and characteristics of the force transducing system change from a spring constant type to one which is hydraulically force compensating. As a consequence, a more effective use of force is obtained and bonds can be made at reduced ram pressures.

In the embodiment illustrated and described herein, no optical monitoring device has been disclosed. It will be apparent, however, that a microscope could easily be used. If so, the mechanical formation of the union could be monitored during the bond as well as the alignment between the leads and lands. Similarly, conventional infrared or optical sensors could readily be employed to gather data concerning temperature of the leads and lands as the bond progressed. Finally, it would be a relatively simple matter to combine the temperature and optical systems for automatic sensing thereby permitting a rapid and accurate, as well as automatic, bonding process.

It will be further noted that while the apparatus and techniques described are particularly adapted for use with sub-miniature devices, they are equally adaptable to macroscopic apparatus. In either case, however, improved results are achieved when the leads or lands are composed of multiple layers. In the embodiment disclosed in FIG. 4, for example, each lead 24 comprises a base 80 made of a conventional electrically conducting material such as copper and a contact 81 made of a soft electrically conducting material such as gold or other easily deformed metal.

The contact 81, however, need not be made of a separate material. It can, instead, merely be a raised portion or dimple on the surface of the base 80. It is important, however, that the contact 81 rise above the surface of the base 80.

If all of the contacts 81 project above the surfaces of their respective bases 80, a good bond with the leads 26 will be assured. Moreover, by carefully shaping the contacts 81, especially height and cross-section, compensation for minor misalignments between the chip 20 and the lead 21 will occur spontaneously. Obviously, however, better results will be obtained when the contact 81 is made of a soft metal such as gold.

Figure 4:
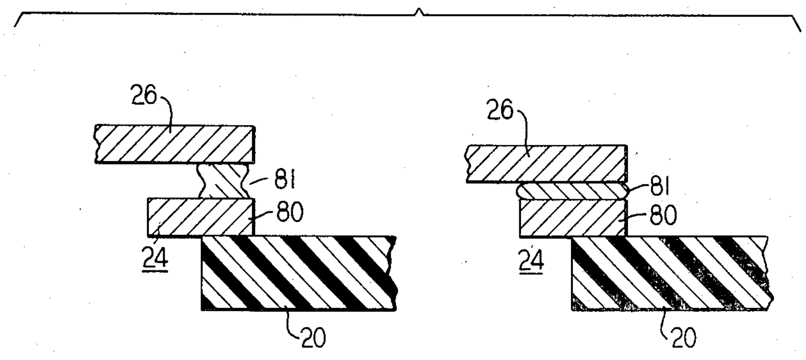
FIG. 4 is a fragmentary view of a lead and land on a circuit device and circuit device support, respectively, during various stages of bonding.

The gold contact 81, at relatively low pressure, will deform as illustrated in FIG. 4 and will continue to do so for a relatively long period before the pressure at the leads 26 or the bases 80 reaches magnitudes sufficient to cause either to deform. By appropriate sizing of the height and cross-section of the contact 81, therefore, all warpage or misalignment errors can be compensated before the "worst" contact 81 reaches total deformation. Consequently, this technique insures that all of the bonds will be mechanically good and bonding efficiency will be improved.

In the embodiment disclosed, the ram 70 has been applied to the back surface of the lead frame 21. Equally good results can be obtained, however, if the components are reversed. Specifically, the lead frame 21 could be transported by a modified form of the carrier 60 and the chip 20 could be inserted into the housing 30. While such an arrangement might impair the monitoring advantage obtained in the former mode, it is nevertheless anticipated that many occasions will arise when such a rearrangement will prove most useful.

Finally, it will be recognized that substantial savings can be achieved in the amount of contact material used. Specifically, although the chip 20 shown in FIG. 1 has an overhanging portion for each lead 26, it need not be so equipped. For example, only enough projections are required to be sure alignment is correct. That is, if the leads 21 are accurately spaced, as they are in integrated circuit technology, only two or three projections would be required to assure proper alignment with the lands 24 on the lead frame 21. In that case, most of the leads 26 could be reduced in size and considerable amounts of contact material could be saved. Where the leads 26 are made from gold or other precious metal, the savings would obviously be substantial.

In summary, a way of achieving accurate and precise bonding has been disclosed in which constant monitoring of the overlap between leads and lands can be maintained during the entire bonding process. While only one embodiment has been disclosed, it will be understood that it is merely illustrative of the principles of the invention and other embodiments will occur to those skilled in the art which will fall within the scope of the invention.

What is claimed is:

1. In apparatus for simultaneously bonding the leads on the front surface of a miniature circuit device to lands located on the front surface of a circuit device support, the combination comprising:

housing means for locating the lands on the front surface of said circuit device support in face-to-face relationship with the leads located on the front surface of said circuit device;

ram means for simultaneously applying heat and pressure to the back surface of said circuit device support when said leads and lands are in contact with each other, said ram means being mounted for reciprocal movement in said housing;

a transparent plate for resisting pressure exerted by said ram means, said transparent plate being fixedly mounted in said housing in register with said ram means; and carrier means for locating the leads on said circuit device in contact with the lands on the front surface of said circuit device support when said ram means applies heat and pressure thereto, said carrier means being transparent whereby alignment between the leads and lands can be observed at all times during the bonding operation.

2. The combination in accordance with claim 1 wherein a portion of said carrier means is a fluid during the bonding process.

3. The combination in accordance with claim 1 wherein said carrier means is made of a plastic material.

4. The combination in accordance with claim 3 wherein said carrier means comprises an elongated strip of plastic extending through said housing means and includes indented portions for receiving circuit devices.

5. The combination in accordance with claim 1 wherein said transparent plate is made of quartz.

6. The combination in accordance with claim 1 wherein said carrier means is an integral part of said transparent plate.

7. The combination in accordance with claim 1 further including observing means for monitoring the relationship between said leads and lands during and before the bonding operation.

8. The combination in accordance with claim 7 wherein said observing means includes a pair of mirrors arranged to reflect images of the overlapping portions of said leads and lands which are located at the ends of said circuit device.

* * * * *